United States Patent
Li

(10) Patent No.: US 10,062,771 B2
(45) Date of Patent: Aug. 28, 2018

(54) LOW TEMPERATURE POLY-SILICON THIN FILM TRANSISTOR AND METHOD OF MANUFACTURING THE SAME

(71) Applicant: Shenzhen China Star Optoelectronics Technology Co., Ltd., Shenzhen, Guangdong (CN)

(72) Inventor: Jinming Li, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/303,452

(22) PCT Filed: May 5, 2016

(86) PCT No.: PCT/CN2016/081074
§ 371 (c)(1),
(2) Date: Oct. 11, 2016

(87) PCT Pub. No.: WO2017/140036
PCT Pub. Date: Aug. 24, 2017

(65) Prior Publication Data
US 2018/0040717 A1 Feb. 8, 2018

(30) Foreign Application Priority Data

Feb. 19, 2016 (CN) .......................... 2016 1 0094823

(51) Int. Cl.
*H01L 21/00* (2006.01)
*H01L 29/66* (2006.01)
(Continued)

(52) U.S. Cl.
CPC .. *H01L 29/66757* (2013.01); *H01L 21/02068* (2013.01); *H01L 21/02488* (2013.01);
(Continued)

(58) Field of Classification Search
CPC .................................................. H01L 21/02068
See application file for complete search history.

(56) References Cited

U.S. PATENT DOCUMENTS

2006/0292836 A1* 12/2006 Peng ....................... C23C 14/58
438/482

FOREIGN PATENT DOCUMENTS

| CN | 1725512 A | 1/2006 |
|---|---|---|
| CN | 101330004 A | 12/2008 |

(Continued)

*Primary Examiner* — William Harriston
(74) *Attorney, Agent, or Firm* — Andrew C. Cheng

(57) ABSTRACT

The present disclosure relates to a low temperature poly-silicon thin film transistor and a method of preparing the same. The low temperature poly-silicon thin film transistor includes a substrate, a metal induction layer formed on the substrate, a barrier layer formed on the metal induction layer, and an amorphous silicon film layer formed on the barrier layer, the amorphous silicon film layer being converted into a poly-silicon film layer under the inducing effect of the metal induction layer, and the poly-silicon film layer being an active layer. In the present disclosure, although the active layer is obtained by using the metal induction method, the metal induction layer is provided below the amorphous silicon film layer, and a barrier layer is provided between the metal induction layer and the amorphous silicon film layer.

16 Claims, 2 Drawing Sheets

(51) Int. Cl.
*H01L 29/786* (2006.01)
*H01L 21/02* (2006.01)

(52) U.S. Cl.
CPC .. *H01L 21/02491* (2013.01); *H01L 21/02502* (2013.01); *H01L 21/02532* (2013.01); *H01L 21/02592* (2013.01); *H01L 21/02672* (2013.01); *H01L 29/78675* (2013.01)

(56) References Cited

FOREIGN PATENT DOCUMENTS

| | | | |
|---|---|---|---|
| CN | 101494242 | A | 7/2009 |
| CN | 10183412 | A | 9/2010 |
| CN | 101834211 | A | 9/2010 |
| CN | 104299891 | A | 1/2015 |
| CN | 105470312 | A | 4/2016 |
| JP | 59-4178 | A | 1/1984 |

\* cited by examiner

LOW TEMPERATURE POLY-SILICON THIN FILM TRANSISTOR AND METHOD OF MANUFACTURING THE SAME

BACKGROUND

1. Technical Field

The present invention relates to a wafer manufacture field and a display technical field, and specifically relates to a low temperature poly-silicon thin film transistor and a method of preparing the same.

2. Background Art

A thin film transistor (TFT) is used as a switching element in a liquid crystal display device, which is characterized in lower power consumption, smaller size and lower driving voltage, and is especially applicable to the display devices of computer, laptop and other devices. In current liquid crystal display devices, an active layer of the thin film transistor mainly adopts amorphous silicon (a-Si), while the thin film transistor adopting the amorphous silicon as the active layer has a low mobility, and can hardly satisfy the driving demands of peripheral circuits, hence a technology of using the low temperature poly-silicon (LTPS) to replace the amorphous silicon is developed.

In the low temperature poly-silicon, an arrangement of atoms is uniform, and a mobility of carriers is high (10 $cm^2$/Vs-300 $cm^2$/Vs), thus a drive current thereof is relatively high, which can reduce a reaction time of liquid crystal molecules, reduce a size of the thin film transistor and increase a through area in a pixel unit, thereby achieving higher brightness and resolution for the display device. Therefore, the application of the low temperature poly-silicon is more advantageous than that of the amorphous silicon material in the thin film transistor.

In the prior art, preparation methods of the low temperature poly-silicon thin film mainly includes a direct growth method, an excimer laser anneal method (ELA) and a metal induction method.

Wherein the direct growth method is mainly grow the low temperature poly-silicon thin film directly on a buffer layer by using apparatuses such as ultrahigh vacuum chemical vapor deposition (CVD) to grow, a advantage of which is to reduce the processing time due to not needing to process annealing. However, the low temperature poly-silicon thin film prepared through the direct growth method may have a rough surface, which may significantly reduce the mobility of the carriers and the stability of the respective performances of the low temperature poly-silicon thin film.

The excimer laser anneal method mainly uses laser annealing to convert the amorphous silicon into the low temperature poly-silicon through crystallization, which can prepare the low temperature poly-silicon thin film with higher carrier mobility. However, due to the influence of laser beam, the excimer laser anneal method may have a poor repeatability, hence the uniformity of the prepared low temperature poly-silicon thin film may be relatively low, which can hardly realize a large area of crystallization. Moreover, the apparatuses for carrying out the excimer laser anneal method are very expensive, and the processing temperature of said method is high, hence the excimer laser anneal method is not applicable to the conventional substrate.

The metal induction method mainly includes adding some metal ions (such as Al ions, Cu ions, Au ions, Ag ions, etc.) into an amorphous silicon or forming a metal induction layer (such as Al, etc.) on a surface of the amorphous silicon, so as to reduce the phase change energy when converting the amorphous silicon into the poly-silicon by using the inducing effect of the metal ions, thereby achieving a quick conversion from the amorphous silicon to the poly-silicon. However, when preparing the low temperature poly-silicon thin film transistor by using said method, there may be a certain amount of residues of metal ions within the thin film transistor, causing a relatively high off-state current of the thin film transistor, thus affecting the performance of the thin film transistor. Therefore, it is necessary to optimize or improve the related techniques and device structures for preparing the low temperature poly-silicon thin film transistor by using the metal induction method, so as to solve the problem of the metal ions residue within the low temperature poly-silicon thin film transistor.

SUMMARY

In order to overcome the defects of the prior art, the present disclosure aims to provide a low temperature poly-silicon thin film transistor and a method of preparing the same, so as to solve the problem of metal ion residue within the thin film transistor through the optimization of the thin film transistor structure and the improvement of the condition of the preparation method.

The present disclosure includes two aspects, and in one aspect, the present disclosure provides a low temperature poly-silicon thin film transistor including: a substrate; a metal induction layer formed on the substrate; a barrier layer formed on the metal induction layer; an amorphous silicon film layer formed on the barrier layer, the amorphous silicon film layer being converted into a poly-silicon film layer under the inducing effect of the metal induction layer, and the poly-silicon film layer being an active layer.

Furthermore, the amorphous silicon film layer being converted into the poly-silicon film layer under the inducing effect of the metal induction layer refers to diffusing the metal ions of the metal induction layer into the amorphous silicon film layer by using a rapid thermal annealing process, and converting the amorphous silicon film layer into the poly-silicon film layer through the induction of the metal ions.

Wherein the inducing effect of the metal induction layer is further described as follows: controlling an amount of the metal ions in the metal induction layer diffusing into the amorphous silicon film layer through controlling a heating curve in the rapid thermal annealing process, so that the metal ions entering into the amorphous silicon film layer upward react with Si under the high temperature to form a metal silicide. The process of forming the metal silicide may release heat energy, and a difference in change of lattice positions at an interface where the a-Si contacts the metal silicide is present, so that the a-Si atoms recrystallize at the interface to form p-Si, while the metal silicide is separated, and the metal ions may be further diffused to the uncrystallized a-Si, then the above procedures are repeated to eventually form the poly-silicon layer.

Wherein the rapid thermal annealing is referred to RTA for short.

[Metal induction layer-Light shielding layer] Furthermore, in the low temperature poly-silicon thin film transistor as mentioned in the present disclosure, the metal induction layer is patterned to obtain the patterned metal induction layer.

Furthermore, patterning the metal induction layer includes coating photoresist and performing exposure, development and etching on the metal induction layer.

[Metal induction layer-Material] Furthermore, in the low temperature poly-silicon thin film transistor as mentioned in the present disclosure, a material chosen for the metal induction layer is one of the nickel or the nickel silicon alloy.

[Metal induction layer-Content] Furthermore, in the low temperature poly-silicon thin film transistor as mentioned in the present disclosure, a material chosen for the metal induction layer is the nickel silicon alloy, also, in a top of the metal induction layer, a mass percentage of the nickel in the nickel silicon alloy is 1%-15%. Wherein the mass percentage being 1%-15% includes values of any points within said value range, for example, the mass percentage is 1%, 2%, 3%, 4%, 5%, 6%, 8%, 10%, 12%, 13%, or 15%.

Wherein, the top of the metal induction layer refers to a portion in the metal induction layer close to the barrier layer and/or contacting the barrier layer.

Preferably, in the top of the metal induction layer, a mass percentage of the nickel in the nickel silicon alloy is 1%-10%.

[Metal induction layer-Thickness] Furthermore, in the low temperature poly-silicon thin film transistor as mentioned in the present disclosure, a thickness of the metal induction layer is 200 Å-1200 Å, Wherein the thickness of the metal induction layer being 200 Å-1200 Å includes values of any points within said value range, for example the thickness of the metal induction layer is 200 Å, 300 Å, 400 Å, 500 Å, 600 Å, 800 Å, 1000 Å, or 1200 Å.

Preferably, the thickness of the metal induction layer is 300 Å-1000 Å.

[Metal induction layer-Process] Furthermore, in the low temperature poly-silicon thin film transistor as mentioned in the present disclosure, the metal induction layer is obtained through physical deposition process.

[Barrier layer-Material] Furthermore, in the low temperature poly-silicon thin film transistor as mentioned in the present disclosure, a material chosen for the barrier layer is $SiO_x$.

[Barrier layer-Thickness] Furthermore, in the low temperature poly-silicon thin film transistor as mentioned in the present disclosure, a thickness of the barrier layer is 10 Å-200 Å. Wherein the thickness of the barrier layer being 20 Å-200 Å includes values of any points within said value range, for example, the thickness of the barrier layer is 10 Å, 20 Å, 30 Å, 50 Å, 60 Å, 80 Å, 100 Å, 120 Å, 150 Å, 160 Å, 180 Å, or 200 Å.

In the present disclosure, the barrier layer is provided to allow the metal ions in the metal induction layer to pass through the barrier layer and enter the amorphous silicon film layer at a beginning stage in the process of converting the amorphous silicon film layer into the poly-silicon film layer, and as the conversion proceeds, the barrier layer gradually forms a dense film structure so as to prevent too many metal ions from entering the amorphous silicon film layer, hence preventing a large amount of metal ion residue in the amorphous silicon film layer. For this purpose, the barrier layer should not be too thick or too thin. If the barrier layer is too thick, it may block the diffusion of the metal ions in the metal induction layer, hence affecting the crystallization effect when converting the amorphous silicon film layer into the poly-silicon film layer, and causing the crystallized grain to be too small. If the barrier layer is too thin, then in a later stage of the conversion, the effective dense film structure can hardly be formed to prevent too many metal ions from entering the amorphous silicon film layer.

Preferably, a thickness of the barrier layer is 20 Å-200 Å.

More preferably, a thickness of the barrier layer is 30 Å-50 Å.

[Barrier layer-Process] Furthermore, in the low temperature poly-silicon thin film transistor as mentioned in the present disclosure, the barrier layer is formed by adopting a plasma enhanced chemical vapor deposition process.

[Amorphous silicon film layer-Thickness] Furthermore, in the low temperature poly-silicon thin film transistor as mentioned in the present disclosure, a thickness of the amorphous silicon film layer is 300 Å-800 Å. Wherein the thickness of the amorphous silicon film layer being 300 Å-800 Å includes values of any points within said value range, for example, the thickness of the amorphous silicon film layer is 300 Å, 400 Å, 500 Å, 600 Å, 700 Å, or 800 Å.

[Amorphous silicon film layer-Process] Furthermore, in the low temperature poly-silicon thin film transistor as mentioned in the present disclosure, the amorphous silicon film layer is formed by adopting a plasma enhanced chemical vapor deposition process.

[Thermal annealing-Temperature] Furthermore, in the low temperature poly-silicon thin film transistor as mentioned in the present disclosure, a heating temperature of the rapid thermal annealing process is 400° C.-800° C. Wherein the heating temperature being 400° C.-800° C. includes values of any points within said value range, for example, the heating temperature is 400° C., 500° C., 550° C., 600° C., 650° C., 700° C., or 800° C.

Preferably, a heating temperature of the rapid thermal annealing process is 500° C.-700° C.

[Removing residual metal ions on top and periphery of active layer] Furthermore, in the low temperature poly-silicon thin film transistor as mentioned in the present disclosure, after forming the active layer, an upper surface film layer of the active layer is removed; performing photoetching and etching on the active layer to obtain the patterned active layer.

In the present disclosure, when amorphous silicon film layer is converted into the poly-silicon film layer (namely, the active layer) under the inducing effect of the metal induction layer, since the metal induction layer is provided below the amorphous silicon film layer, in forming the active layer, the metal ions in the metal induction layer diffuse upward and around after entering the amorphous silicon film layer hence, after forming the active layer, even if the residues of metal ions exists in the active layer, it may only exist in an upper surface film layer of the active layer or around the active layer. Therefore the preparation method of the present disclosure adopts the above steps to remove the upper surface film layer of the active layer after the active layer is formed and to process patterning the active layer by etching off the non-patterned active layer at peripheral regions, thereby completely removing the residual metal ions existing in the upper surface film layer of the active layer or around the active layer.

Furthermore, an hydrofluoric acid (HF) cleaner is adopted to remove the upper surface film layer of the active layer.

[Buffer layer] Furthermore, in the low temperature poly-silicon thin film transistor as mentioned in the present disclosure, a buffer layer is further formed between the substrate and the metal induction layer.

[Buffer layer-Process] Furthermore, the barrier layer is obtained by adopting a plasma enhanced chemical vapor deposition process on the substrate.

[GI structure and so on] Furthermore, the low temperature poly-silicon thin film transistor as mentioned in the present disclosure further includes: a gate insulating layer formed on the active layer; a gate formed on the gate insulating layer; a dielectric layer formed on the gate, the dielectric layer being provided with a source contact hole and a drain contact hole for partially exposing the active layer; a source electrode formed in the source contact hole, the source electrode contacting the active layer through the source contact hole; a drain electrode formed in the drain contact hole, the drain electrode contacting the active layer through the drain contact hole; a passivation layer formed on the dielectric layer, an opening for partially exposing the drain metal layer is disposed in a region of the passivation layer corresponding to the drain electrode. The low temperature poly-silicon thin film transistor further includes a pixel electrode, the pixel electrode contacting the drain through the opening.

Furthermore, the material adopted by the gate is molybdenum.

In another aspect, the present disclosure provides a method of preparing the above mentioned low temperature poly-silicon thin film transistor, the method comprising: providing a substrate; forming a metal induction layer on the substrate; forming a barrier layer on the metal induction layer; forming an amorphous silicon film layer on the barrier layer, converting the amorphous silicon film layer into a poly-silicon film layer under the inducing effect of the metal induction layer, and the poly-silicon film layer being an active layer.

Furthermore, converting the amorphous silicon film layer into the poly-silicon film layer by using the inducing effect of the metal induction layer refers to diffusing the metal ions of the metal induction layer into the amorphous silicon film layer by using a rapid thermal annealing process, and converting the amorphous silicon film layer into the polysilicon film layer through the inducing effect of the metal ions.

Wherein the inducing effect of the metal induction layer is further described as follows: controlling an amount of the metal ions in the metal induction layer diffusing into the amorphous silicon film layer through controlling a heating curve in the rapid thermal annealing process, so that the metal ions entering into the amorphous silicon film layer upward react with Si under the high temperature to form a metal silicide. Since the process of forming the metal silicide may release heat energy, and a difference in change of lattice positions at an interface where the a-Si contacts the metal silicide is present, so that the a-Si atoms recrystallize at the interface to form p-Si, while the metal silicide is separated, and the metal ions may be further diffused to the uncrystallized a-Si, then the above procedures are repeated to eventually form the poly-silicon layer.

Wherein, the rapid thermal annealing is referred to RTA for short.

Furthermore, in the preparation method as mentioned in the present disclosure, after forming the metal induction layer on the substrate, the metal induction layer is patterned to obtain the patterned metal induction layer.

Furthermore, patterning the metal induction layer includes coating photo resist and performing exposure, development and etching on the metal induction layer.

Furthermore, in the preparation method as mentioned in the present disclosure, a material chosen for the metal induction layer is one of the nickel and the nickel silicon alloy.

Furthermore, in the preparation method as mentioned in the present disclosure, a material chosen for the metal induction layer is the nickel silicon alloy, also, in a top of the metal induction layer, a mass percentage of the nickel in the nickel silicon alloy is 1%-15%. Wherein the mass percentage being 1%-15% includes values of any points within said value range, for example, the mass percentage is 1%, 2%, 3%, 4%, 5%, 6%, 8%, 10%, 12%, 13%, or 15%.

Wherein, the top of the metal induction layer refers to a portion in the metal induction layer close to the barrier layer or contacting the barrier layer.

Preferably, in the top of the metal induction layer, a mass percentage of the nickel in the nickel silicon alloy is 1%-10%.

Furthermore, in the preparation method as mentioned in the present disclosure, a thickness of the metal induction layer is 200 Å-1200 Å. Wherein the thickness of the metal induction layer being 200 Å-1200 Å includes values of any points within said value range, for example, the thickness of the metal induction layer is 200 Å, 300 Å, 400 Å, 500 Å, 600 Å, 800 Å, 1000 Å or 1200 Å.

Preferably, the thickness of the metal induction layer is 300 Å-1000 Å.

Furthermore, in the preparation method as mentioned in the present disclosure, the metal induction layer is obtained through physical deposition process.

Furthermore, in the preparation method as mentioned in the present disclosure, a material chosen for the barrier layer is $SiO_x$.

Furthermore, in the preparation method as mentioned in the present disclosure, a thickness of the barrier layer is 10 Å-200 Å. Wherein the thickness of the barrier layer being 20 Å-200 Å includes values of any points within said value range, for example, the thickness of the barrier layer is 10 Å, 20 Å, 30 Å, 50 Å, 60 Å, 80 Å, 100 Å, 120 Å, 150 Å, 160 Å, 180 Å or 200 Å.

In the present disclosure, the barrier layer is provided to allow the metal ions in the metal induction layer to pass through the barrier layer and enter the amorphous silicon film layer at a beginning stage in the process of converting the amorphous silicon film layer into the poly-silicon film layer, and as the conversion proceeds, the barrier layer gradually forms a dense film structure so as to prevent too many metal ions from entering into the amorphous silicon film layer, hence preventing a large amount of residues of metal ions, and preventing the metal ions from further diffusing into the active layer in other subsequent processes. For this purpose, the barrier layer should not be too thick or too thin. If the barrier layer is too thick, it may block the diffusion of the metal ions in the metal induction layer, hence affecting the crystallization effect when converting the amorphous silicon film layer into the poly-silicon film layer, and causing the crystallized grain to be too small. If the barrier layer is too thin, then in a later stage of the conversion, a effective dense film structure can hardly be formed to prevent too many metal ions from entering the amorphous silicon film layer.

Preferably, a thickness of the barrier layer is 20 Å-200 Å. More preferably, a thickness of the barrier layer is 30 Å-50 Å. Furthermore, in the preparation method as mentioned in the present disclosure, the barrier layer is formed by using a plasma enhanced chemical vapor deposition process.

Furthermore, in the preparation method as mentioned in the present disclosure, a thickness of the amorphous silicon film layer is 300 Å-800 Å. Wherein the thickness of the amorphous silicon film layer being 300 Å-800 Å includes values of any points within said value range, for example, the thickness of the amorphous silicon film layer is 300 Å, 400 Å, 500 Å, 600 Å, 700 Å, or 800 Å.

Furthermore, in the preparation method as mentioned in the present disclosure, forming the amorphous silicon film layer on the barrier layer refers to depositing and forming the amorphous silicon film layer on the barrier layer by using the plasma enhanced chemical vapor deposition process.

Furthermore, in the preparation method as mentioned in the present disclosure, a heating temperature of the rapid thermal annealing process is 400° C.-800° C. Wherein the heating temperature being 400° C.-800° C. includes values of any points within said value range, for example, the heating temperature is 400° C., 500° C., 550° C., 600° C., 650° C., 700° C., or 800° C.

Preferably, a heating temperature of the rapid thermal annealing process is 500° C.-700° C.

Furthermore, in the preparation method as mentioned in the present disclosure, after forming the active layer, an upper surface film layer of the active layer is removed; performing photo etching and etching on the active layer to obtain the patterned active layer.

In the preparation method as mentioned in the present disclosure, when amorphous silicon film layer is converted into the poly-silicon film layer (namely, the active layer) under the inducing effect of the metal induction layer, since the metal induction layer is provided below the amorphous silicon film layer, in forming the active layer, the metal ions in the metal induction layer may diffuse upward and around after entering the amorphous silicon film layer hence, after forming the active layer, even if the residues of metal ions exist in the active layer, it may only exist in an upper surface film layer of the active layer or around the active layer. Therefore the preparation method of the present disclosure adopts the above steps to remove the upper surface film layer of the active layer after the active layer is formed and to pattern the active layer by etching off the non-graphical active layer at peripheral regions, thereby completely removing the residual of metal ions existing in the upper surface film layer of the active layer or around the active layer.

Furthermore, an hydrofluoric acid (HF) cleaner is used to remove the upper surface film layer of the active layer.

Furthermore, in the preparation method as mentioned in the present disclosure, a buffer layer is formed between the substrate and the metal induction layer.

Furthermore, in the preparation method as mentioned in the present disclosure, the barrier layer is obtained by using a plasma enhanced chemical vapor deposition process on the substrate.

Furthermore, the preparation method as mentioned in the present disclosure further comprises:

forming a gate insulating layer on the active layer;
forming a gate on the gate insulating layer;
forming a dielectric layer on the gate, and forming a source contact hole and a drain contact hole for partially exposing the active layer in the dielectric layer;
forming a source in the source contact hole, the source electrode contacting the active layer through the source contact hole; forming a drain in the drain contact hole, the drain contacting the active layer through the drain contact hole;
forming a passivation layer on the dielectric layer, and forming an opening for partially exposing the drain metal layer in a region of the passivation layer corresponding to the drain electrode;
forming a pixel electrode, and allowing the pixel electrode to contact the drain electrode metal layer through the opening.

Furthermore, the material adopted by the gate is molybdenum.

Compared with the prior art, the advantageous effect of the present disclosure is as follows:

in the low temperature poly-silicon thin film transistor prepared in the present disclosure, although the active layer is obtained by using the metal induction method, the metal induction layer in the present disclosure is provided below the amorphous silicon film layer, and a barrier layer is provided between the metal induction layer and the amorphous silicon film layer. At an early stage of the induction process, the ions in the metal induction layer may enter the amorphous silicon film layer smoothly to perform induction of recrystallization, while as the recrystallization proceeds, the barrier layer may effectively prevent the metal ions in the metal induction layer from further entering upward the amorphous silicon film layer, thereby effectively controlling the content of metal ions entering into the amorphous silicon film layer, hence reducing the content of residual metal ions in the poly-silicon film layer after the amorphous silicon film layer is converted into the poly-silicon film layer.

In addition, since the metal induction layer in the present disclosure is provided below the amorphous silicon film layer, the metal ions in the metal induction layer may diffuse upward and around after entering the amorphous silicon film layer for induction of recrystallization, that is, after the amorphous silicon film layer is converted into the poly-silicon film layer, the residual metal ion may only exists on the upper surface and the periphery of the poly-silicon film layer (namely, the active layer), the residual metal ions on the upper surface are removed through a cleaner, and the residual metal ions on the periphery are removed in the subsequent photo etching and etching processes. Accordingly, the content of metal ions residue in the amorphous silicon film layer can be significantly reduced.

DETAILED DESCRIPTION OF EXEMPLARY EMBODIMENTS

Embodiments

Figure 7:
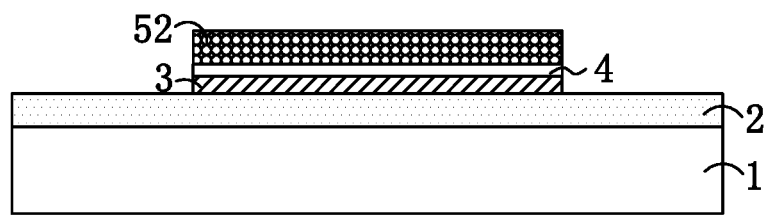

The present embodiment provides a low temperature poly-silicon thin film transistor, and FIG. 7 is a cross-section structural diagram of the low temperature poly-silicon thin film transistor, including: a substrate 1, a buffer layer 2 formed on the substrate 1, a metal induction layer 3 formed on the buffer layer 2, a barrier layer 4 formed on the metal induction layer 3, an active layer 52 formed on the barrier layer 4.

Wherein the buffer layer 2 is formed on the substrate 1 by using the chemical vapor deposition process.

Wherein the metal induction layer 3 is formed on the buffer layer 2 by using a physical deposition process, then the metal induction layer 3 is patterned by coating photoresist and performing exposure, development and etching, to obtain the patterned metal induction layer 3, the patterned metal induction layer also being a light shielding layer of the low temperature poly-silicon thin film transistor of the present embodiment. In the present embodiment, the thickness of the metal induction layer is 300 Å-1000 Å, and is preferably 450 Å, which adopts a material of a nickel silicon alloy, also, in the top of the metal induction layer, the mass percentage of the nickel in the nickel silicon alloy is 1%-10%, and is preferably 5%.

Wherein the barrier layer 4 is formed on the patterned metal induction layer 3 by using a plasma enhanced chemical vapor deposition process. In the present embodiment, the barrier layer is provided to allow the metal ions in the metal induction layer to pass through the barrier layer and enter the amorphous silicon film layer at a beginning stage in the process of converting the amorphous silicon film layer into the poly-silicon film layer, and as the conversion proceeds, the barrier layer gradually forms a dense film structure so as to prevent too many metal ions from entering into the amorphous silicon film layer, hence preventing a large amount of residues of metal ions, and preventing the metal ions from further diffusing into the active layer in other subsequent processes. For this purpose, the barrier layer should not be too thick or too thin. If the barrier layer is too thick, it may block the diffusion of the metal ions in the metal induction layer, hence affecting the crystallization effect when converting the amorphous silicon film layer into the poly-silicon film layer, and causing the crystallized grain to be too small. If the barrier layer is too thin, then in a later stage of the conversion, the dense film structure can hardly be formed to prevent too many metal ions from entering the amorphous silicon film layer. In the present embodiment, a thickness of the barrier layer 4 is 20 Å-200 Å, and is preferably 40 Å, a material chosen for the barrier layer is $SiO_x$, and the O in $SiO_x$ and the Si in the metal induction layer may form a dense silicon oxide film layer structure.

Wherein the forming of the active layer is as follows: depositing and forming the amorphous silicon film layer on the barrier layer 4 by using the plasma enhanced chemical vapor deposition process, the amorphous silicon film layer may have a proper thickness for the need of mass production, for example, a thickness of the amorphous silicon film layer in the present embodiment is 300 Å-800 Å, and preferably, the thickness of the amorphous silicon film layer is 500 Å. Then, after forming the amorphous silicon layer 51, under the inducing effect of the metal induction layer, and by adopting the rapid thermal annealing process, the amorphous silicon film layer 51 is heated at a temperature of 500° C.-700° C., and is then cooled rapidly to convert the amorphous silicon film layer into the poly-silicon film layer, the poly-silicon film layer being the active layer 52.

Figure 6:
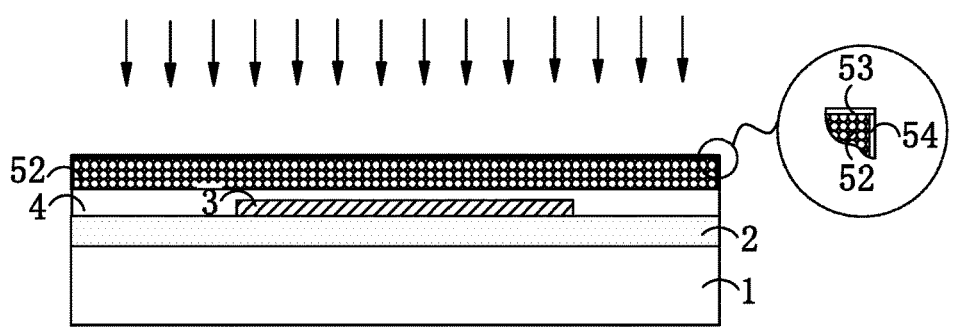

In a process of converting the amorphous silicon film layer into the poly-silicon film layer, since the metal induction layer is provided below the amorphous silicon film layer, the nickel ions in the metal induction layer may diffuse upward and around in the amorphous silicon film layer. Eventually, after the amorphous silicon film layer is converted into the poly-silicon film layer, as shown in FIG. 6, an upper surface film layer 53 having residues of nickel ions is formed on an upper surface of the active layer 52, and a peripheral film layer 54 having the residues of nickel ions is formed around the active layer 52 (since FIG. 6 is a sectional view, only the left and right sides of the active layer are shown in FIG. 6).

Therefore, in the present embodiment, as shown in FIG. 7, an HF cleaner is adopted to remove the upper surface film layer; then a photo etching and a dry etching process are performed on the active layer 52 to obtain the patterned active layer 52. In the above procedure, the peripheral film layer is the active layer in the non-patterned region, hence it is removed during the process of patterning. Through processing the upper surface film layer and the peripheral film layer above mentioned, the residual metal ions in the active layer can be effectively removed.

Next, a gate insulating layer, a gate and a dielectric layer are formed on the patterned active layer, the dielectric layer being provided with a source contact hole and a drain contact hole capable of partially exposing the active layer, and a source being formed in the source contact hole, the source contacting the active layer through the source contact hole, and a drain being formed in the drain contact hole, the drain contacting the active layer through the drain contact hole. A passivation layer is provided on the dielectric layer, the passivation layer forming an opening for partially exposing the drain electrode in a region corresponding to the drain; the low temperature poly-silicon thin film transistor of the present embodiment is also formed with a pixel electrode contacting the drain through the opening. Understandably it may serve as a prior art in the field to form structures such as the gate insulating layer, the gate, the dielectric layer, the source, the drain, the passivation layer, the pixel electrode and the like, sequentially after obtaining the patterned active layer, which will not be repeated hereby.

Figure 1:
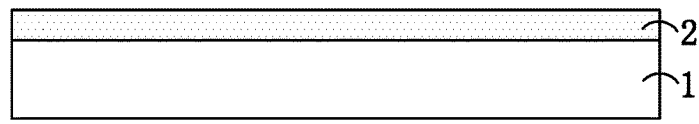
FIGS. 1-7 illustrate the process of the method for manufacturing a low temperature poly-silicon thin film transistor according to the embodiments of the present disclosure.

The present embodiment provides a method of manufacturing the above mentioned low temperature poly-silicon thin film transistor, the method comprising:

As shown in FIG. 1, a substrate 1 is provided, and a buffer layer 2 is formed on the substrate 1 by using the chemical vapor deposition process.

Figure 2:
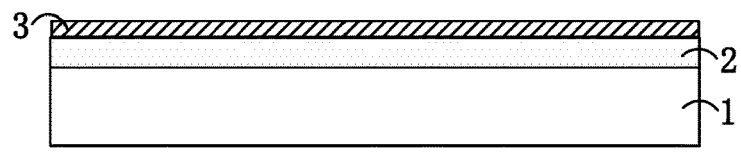
Figure 3:
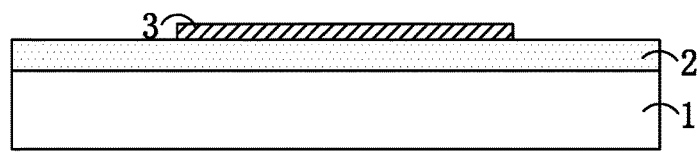

As shown in FIG. 2, a metal induction layer 3 is formed on the buffer layer 2 by using the physical deposition process, and the metal induction layer 3 is patterned by coating photo resist and performing exposure, development and etching, to obtain the patterned metal induction layer 3 as shown in FIG. 3, and the patterned metal induction layer is a light shielding layer of the low temperature poly-silicon thin film transistor of the present embodiment. In the present embodiment, the thickness of the metal induction layer is 300 Å-1000 Å, and is preferably 450 Å, which adopts a material of a nickel silicon alloy, also, in the top of the metal induction layer, the mass percentage of the nickel in the nickel silicon alloy is 1%-10%, and is preferably 5%.

Figure 4:
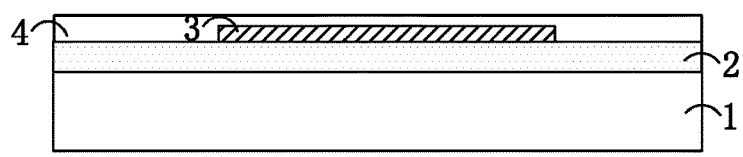

As shown in FIG. 4, the barrier layer 4 is formed on the patterned metal induction layer 3 by using a plasma enhanced chemical vapor deposition process, a thickness of the barrier layer 4 is 20 Å-200 Å, and is preferably 40 Å, and a material chosen for the barrier layer is $SiO_x$.

Figure 5:
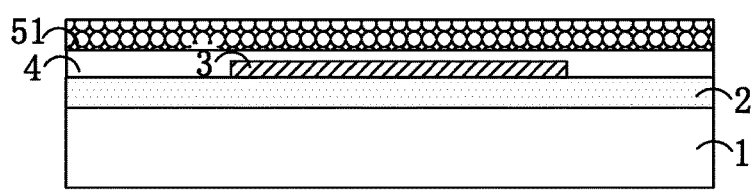

As shown in FIG. 5, amorphous silicon film layer 51 is formed on the barrier layer 4 by using the plasma enhanced chemical vapor deposition process, the amorphous silicon film layer may have a proper thickness for the need of mass production, for example, a thickness of the amorphous silicon film layer in the present embodiment is 300 Å-800 Å, preferably, a thickness of the amorphous silicon film layer is 500 Å.

As shown in FIG. 6, the amorphous silicon film layer is converted into a poly-silicon film layer under the inducing effect of the metal induction layer. More particularly, by adopting the rapid thermal annealing process, the amorphous silicon layer 51 is heated at a temperature of 500° C.-700° C., so that the nickel ions in the metal induction layer 3 may diffuse into the amorphous silicon film layer 51, and the amorphous silicon film layer 51 is converted into the poly-silicon film layer through the induction of the nickel ions, the poly-silicon film layer being the active layer 52.

In a process of converting the amorphous silicon film layer into the poly-silicon film layer, since the metal induction layer is provided below the amorphous silicon film layer, the nickel ions in the metal induction layer may diffuse upward and around in the amorphous silicon film layer. Eventually, after the amorphous silicon film layer is converted into the poly-silicon film layer, As shown in FIG. 6, an upper surface film layer 53 having residues of nickel ions is formed on an upper surface of the active layer 52, and a peripheral film layer 54 having the residues of nickel ions is formed around the active layer 52 (since FIG. 6 is a sectional view, only the left and right sides of the active layer are shown in FIG. 6).

Therefore, in the present embodiment, as shown in FIG. 7, an HF cleaner is adopted to remove the upper surface film layer 53; then a photo etching and a dry etching process are performed on the active layer 52 to obtain the patterned active layer 52. In the above procedure, the peripheral film layer 54 is the active layer in the non-patterned region, hence it is removed during the process of patterning. Through the processing on the upper surface film layer and the peripheral film layer, the residual metal ions in the active layer can be effectively removed.

Next, a gate insulating layer, a gate and a dielectric layer are formed sequentially on the patterned active layer through deposition, a source contact hole and a drain contact hole capable of partially exposing the active layer being formed in the dielectric layer. A source is formed in the source contact hole, the source contacting the active layer through the source contact hole, and a drain is formed in the drain contact hole, the drain contacting the active layer through the drain contact hole. A passivation layer is formed on the dielectric layer through deposition, the passivation layer forming an opening for partially exposing the drain electrode in a region corresponding to the drain; the low temperature poly-silicon thin film transistor of the present embodiment is also formed with a pixel electrode contacting the drain through the opening. Understandably it may serve as a prior art in the field to form structures such as the gate insulating layer, the gate, the dielectric layer, the source, the drain, the passivation layer, the pixel electrode, and the like, subsequently after obtaining the patterned active layer, which will not be repeated hereby.

Here, a principle of the present embodiment effectively solving the problem of residues of metal ions in the active layer is described.

First, the principle of the present embodiment converting the amorphous silicon film layer into the poly-silicon film layer under the inducing effect of the metal induction layer is as follows: under the high temperature, the Ni ions in the metal induction layer contact with the amorphous silicon film layer to form the contact interface, and the Ni may interact with the Si to form the $Ni_ySi$ compound (namely, the metal silicide); in forming the NiySi compound, due to the release of heat energy, and a difference in change of the lattice position of a-Si at an interface, the a-Si atoms may recrystallize at the interface to form p-Si, hence causing the $Ni_ySi$ compound to be damaged, the Ni ions may further diffuse to the uncrystallized a-Si, and the procedure of forming the $Ni_ySi$ compound, forming p-Si through recrystallization of a-Si and damaging the $Ni_ySi$ compound may be repeated, until the a-Si is completely converted into p-Si (namely, the poly-silicon film layer).

Secondly, the principle of the barrier layer is as follows: a material chosen for the barrier layer in the present embodiment is $SiO_x$, and the film layer is relatively thin. During the metal induction, an early stage is a heating process, in which a length of the Si—O bond in the $SiO_x$ structure is relatively long, hence the Ni ions in the metal induction layer under the barrier layer can pass through the barrier layer quickly and enter the a-Si layer to perform induction; while as the temperature rises and the induction proceeds, the remaining Si in the metal induction layer may combine with the O in the barrier layer to form the thermal oxidized dense silicon oxide, and the length of the Si—O bond in the $SiO_x$ gradually decreases, so that the Ni ions in the metal induction layer can hardly enter the amorphous silicon film layer through the barrier layer. Accordingly, the barrier layer can realize control over the content of the metal ions entering the amorphous silicon film layer, which can perform the barrier function.

Understandably the above contents only describe the main structure of the low temperature poly-silicon thin film transistor, while the low temperature poly-silicon thin film transistor may also include other conventional function structures, which will not be repeated in the present disclosure.

The embodiments of the present disclosure as mentioned above are only the examples made for clearly illustrate the present disclosure, rather than definitions made on the embodiments of the present disclosure. To those skilled in the art, other changes or modifications of different forms can be made based on the above description. Here, it is unnecessary to enumerate all the embodiments. Any modifications, substitutions and improvements made within the spirit and principle of the present disclosure shall fall within the protection scope of the claims of the present disclosure.

What is claimed is:

1. A low temperature poly-silicon thin film transistor comprising a substrate and a metal induction layer formed on the substrate, wherein the low temperature poly-silicon thin film transistor further comprises:
    a barrier layer formed on the metal induction layer;
    an amorphous silicon film layer formed on the barrier layer;
    wherein the amorphous silicon film layer being converted into a poly-silicon film layer under the inducing effect of the metal induction layer, and the poly-silicon film layer being an active layer; and
    wherein the metal induction layer is patterned to obtain a patterned metal induction layer.

2. The low temperature poly-silicon thin film transistor according to claim 1, wherein a material chosen for the metal induction layer is one of nickel and nickel silicon alloy.

3. The low temperature poly-silicon thin film transistor according to claim 2, wherein a material chosen for the metal induction layer is nickel silicon alloy, and in a top of the metal induction layer, a mass percentage of the nickel in the nickel silicon alloy is 1%-15%.

4. The low temperature poly-silicon thin film transistor according to claim 1, wherein a thickness of the metal induction layer is 200 Å-1200 Å.

5. The low temperature poly-silicon thin film transistor according to claim 1, wherein a material chosen for the barrier layer is $SiO_x$.

6. The low temperature poly-silicon thin film transistor according to claim 1, wherein a material chosen for the barrier layer is $SiO_x$.

7. The low temperature poly-silicon thin film transistor according to claim 2, wherein a material chosen for the barrier layer is $SiO_x$.

8. The low temperature poly-silicon thin film transistor according to claim 3, wherein a material chosen for the barrier layer is $SiO_x$.

9. The low temperature poly-silicon thin film transistor according to claim 4, wherein a material chosen for the barrier layer is $SiO_x$.

10. The low temperature poly-silicon thin film transistor according to claim 1, wherein a thickness of the barrier layer is 20 Å-200 Å.

11. The low temperature poly-silicon thin film transistor according to claim 1, wherein a thickness of the barrier layer is 20 Å-200 Å.

12. The low temperature poly-silicon thin film transistor according to claim 2, wherein a thickness of the barrier layer is 20 Å-200 Å.

13. The low temperature poly-silicon thin film transistor according to claim 3, wherein a thickness of the barrier layer is 20 Å-200 Å.

14. The low temperature poly-silicon thin film transistor according to claim 4, wherein a thickness of the barrier layer is 20 Å-200 Å.

15. A method of preparing a low temperature poly-silicon thin film transistor, wherein the method comprises:
    providing a substrate;
    forming a metal induction layer on the substrate;
    forming a barrier layer on the metal induction layer;
    forming an amorphous silicon film layer on the barrier layer, and converting the amorphous silicon film layer into a poly-silicon film layer under the inducing effect of the metal induction layer, and the poly-silicon film layer being an active layer; and
    wherein after forming the active layer, an upper surface film layer of the active layer is removed; and
    performing photoetching and etching on the active layer to obtain the patterned active layer.

16. The preparation method according to claim 15, wherein converting the amorphous silicon film layer into the poly-silicon film layer under the inducing effect of the metal induction layer refers to diffusing the metal ions of the metal induction layer into the amorphous silicon film layer by using a rapid thermal annealing process, and converting the amorphous silicon film layer into the poly-silicon film layer through the induction of the metal ions.

* * * * *